(12) United States Patent
Soerensen et al.

(10) Patent No.: US 7,007,132 B2
(45) Date of Patent: Feb. 28, 2006

(54) METHODS AND APPARATUS FOR UTILIZING FLASH BURST MODE TO IMPROVE PROCESSOR PERFORMANCE

(75) Inventors: Joern Soerensen, Aars (DK); Paul D. Krivacek, Cambridge, MA (US); Michael S. Allen, Austin, TX (US); Mark A. Banse, Austin, TX (US)

(73) Assignee: Analog Devices, Inc., Norwood, MA (US)

( * ) Notice: Subject to any disclaimer, the term of this patent is extended or adjusted under 35 U.S.C. 154(b) by 146 days.

(21) Appl. No.: 10/230,668

(22) Filed: Aug. 29, 2002

(65) Prior Publication Data

US 2003/0070051 A1    Apr. 10, 2003

Related U.S. Application Data

(60) Provisional application No. 60/315,655, filed on Aug. 29, 2001.

(51) Int. Cl.
    *G06F 12/00*    (2006.01)

(52) U.S. Cl. .................. 711/103; 711/167; 711/169
(58) Field of Classification Search ........ 711/103–105, 711/167, 169
     See application file for complete search history.

(56) References Cited

U.S. PATENT DOCUMENTS

| 5,673,398 A | * | 9/1997 | Takeda ................... 710/105 |
| 6,172,936 B1 | * | 1/2001 | Kitazaki .................. 365/233 |
| 6,205,084 B1 | | 3/2001 | Akaogi |
| 6,564,285 B1 | * | 5/2003 | Mills et al. ............. 711/103 |

FOREIGN PATENT DOCUMENTS

| EP | 0 978 842 A1 | 2/2000 |
| EP | 1 103 977 A1 | 5/2001 |
| EP | 1 103 978 A1 | 5/2001 |
| EP | 1 132 819 A2 | 9/2001 |

* cited by examiner

*Primary Examiner*—B. James Peikari
*Assistant Examiner*—Woo H. Choi
(74) *Attorney, Agent, or Firm*—Wolf, Greenfield & Sacks, P.C.

(57) ABSTRACT

Methods and apparatus for accessing flash memory in a continued burst mode are provided. The apparatus includes a processor for executing instructions including memory access instructions, the processor generating a next access signal that indicates if a next memory access is in sequence with a current memory access, a memory having a continued burst mode of operation, and a bus interface for controlling access to the memory in response to the memory access instructions. The bus interface unit enables the continued burst mode of the memory while the next access signal is asserted.

5 Claims, 2 Drawing Sheets

| NORMAL 70 nS | BURST BUFFER | CONTINUES BURST WITH VARIABLE LENGTH |
|---|---|---|
| 4*70 | 70+3*20 | |
| 4*70 | 70+3*20 | 1*70+3*20 |
| 4*70 | 70+3*20 | 4*20 |
| 1*70 | | 4*20 |
| 4*70 | | |
| 1*70 | | 1*70 |
| | | 4*20 |
| | | 1*20 |
| 840 | 390 | 290 |

| NORMAL 70 nS | | CONTINUES BURST WITH VARIABLE LENGTH |
|---|---|---|
| 1*70 | | |
| 4*70 | | |
| 1*70 | | |
| 420 | | 170 |

FIG. 2

METHODS AND APPARATUS FOR UTILIZING FLASH BURST MODE TO IMPROVE PROCESSOR PERFORMANCE

CROSS REFERENCE TO RELATED APPLICATION

This application claims the benefit of provisional application Ser. No. 60/315,655, filed Aug. 29, 2001, which is hereby incorporated by reference in its entirety.

FIELD OF THE INVENTION

The present invention relates to digital processing systems and, more particularly, to methods and apparatus for improving processor performance by utilizing the continued burst mode of a flash memory.

BACKGROUND OF THE INVENTION

Embedded baseband processors, such as those used in wireless applications, may include a digital signal processor, a microcontroller and memory on a single chip. In wireless applications, processing speed is critical because of the need to maintain synchronization with the timing of the wireless system. The processing speed of the microcontroller is largely determined by the associated memory systems and in particular by a flash memory system that is external to the baseband processor. One way of improving processing speed is to copy code from the external memory to the internal chip memory, which may run at processor speed and may have a larger bus width than the external memory. However, the code base may exceed the capacity of the on-chip memory. In addition, on-chip memory is utilized, at least in part, for data storage in addition to code storage.

One option to improve microcontroller speed is to add a cache memory. However, the code structure for a typical communications processor is such that little improvement is achieved by the use of cache memory. In particular, the code may be written such that a large portion of the code is utilized on each pass. The code structure includes many function calls and conditional code. The result is that program flow is typically discontinuous, resulting in poor cache performance.

Burst mode flash memories may be utilized to fill cache memories more quickly. A burst mode flash memory is one in which accessing the first word of a burst takes about the same time as a traditional flash memory (70–120 nS typical), while accessing the following words of the burst is much faster (20–25 nS typical). A typical burst mode flash memory has a fixed burst length, for example, 4 words. By way of example, reading a burst of 4 words results in a possible total access time of 70+20+20+20 nS=130 nS, where reading these 4 words as single words would result in 4*70 nS=280 nS. A burst buffer may be used to read ahead of the microcontroller. A problem with this approach is that the microcontroller may need only a few of the instructions in the burst due to the program structure. In particular, words read from the flash memory may not be needed due to a program flow discontinuity. Thus, the use of a burst buffer does not produce a significant improvement in performance.

Accordingly, there is a need for improved methods and apparatus for utilizing the burst mode of flash memories to improve processor performance.

SUMMARY OF THE INVENTION

Accordingly to a first aspect of the invention, digital processing apparatus is provided. The digital processing apparatus comprises a processor for executing instructions including memory access instructions, the processor generating a next access signal that indicates if a next memory access is in sequence with a current memory access, a memory having a continued burst mode of operation, the memory having a memory bus for communication with the processor, and a bus interface unit for controlling access to the memory in response to the memory access instructions. The bus interface unit enables the continued burst mode of the memory while the next access signal is asserted.

According to another aspect of the invention, a method is provided for accessing memory in a digital processing system. The method comprises providing a processor for executing instructions including memory access instructions, the processor generating a next access signal that indicates if a next memory access is in sequence with a current memory access, providing a memory having a continued burst mode, and enabling the continued burst mode of the memory while the next access signal is asserted.

BRIEF DESCRIPTION OF THE DRAWINGS

For a better understanding of the present invention, reference is made to the accompanying drawings, which are incorporated herein by reference and in which:

FIG. 2 is a table that illustrates an example and provides a comparison of results achieved with the invention and results achieved with prior art methods.

DETAILED DESCRIPTION

Figure 1:
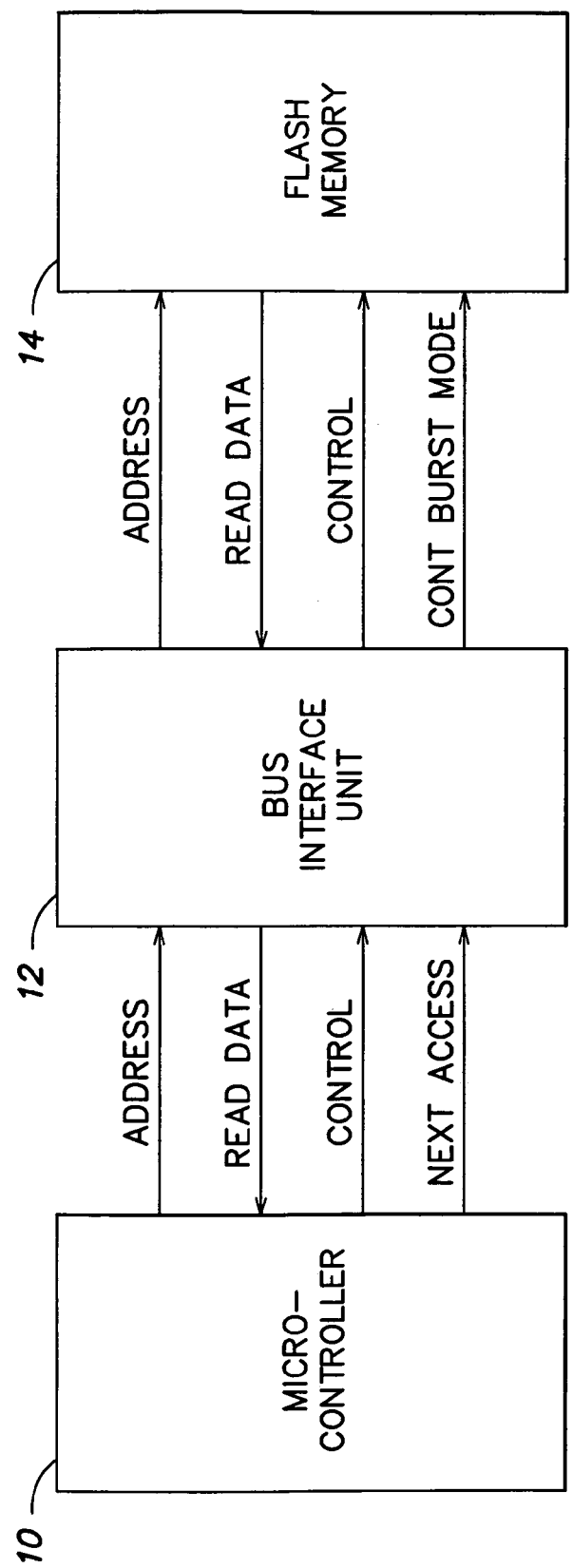
FIG. 1 is a block diagram of a digital processing system in accordance with an embodiment of the invention.

According to an aspect of the invention, a digital processing system utilizes a flash memory of the type having a continued burst mode capability. The continued burst mode is one which permits a burst access to continue without limitation on the burst length or which permits a burst access with a very long burst length. The continued burst mode may be variable in length depending on the state of a burst mode enable signal. In addition, the continued burst mode permits a burst access to continue without restriction on the address boundary. Thus, for example, the flash memory may supply data words at consecutive memory addresses for as long as a continued burst mode enable signal is asserted.

According to another aspect of the invention, a digital processing system utilizes a processor of the type that generates a "Next Access" signal or similar signal. The Next Access signal indicates if the next memory access is in sequence with the current memory access or not. In particular, the Next Access signal indicates if the next address equals the current address +1. An example of a processor that provides a Next Access signal, also referred to as the nSEQ signal, is the ARM7TDMI microcontroller supplied by Advanced Risk Machines. Thus, when the Next Access signal is asserted, the next address equals the current address +1. When the Next Access signal is not asserted, the next access is to an address other than the current address +1.

The Next Access signal may be used by a bus interface unit to control the continued burst mode of a flash memory. Thus, when the Next Access signal is asserted, the bus interface unit may enable the continued burst mode of the flash memory and continue reading in burst mode. When the Next Access signal is deasserted by the processor, the burst read is discontinued, thereby providing a burst read of variable length. This approach takes advantage of the fast access times in the burst mode of the flash memory. Furthermore, by discontinuing the burst mode when the next access signal is deasserted, reading of unused words is avoided. By way of example, the first word in a continued burst may have a 70 nS access time and all subsequent words in the continued burst may have a 20 nS access time. An advantage in performance is achieved by accessing words in a continued burst and by avoiding accessing words which are not used by the processor.

A block diagram of a digital processing system in accordance with an embodiment of the invention is shown in FIG. 1. A microcontroller 10 is coupled via a bus interface unit 12 to a flash memory 14. The microcontroller 10, the bus interface unit 12 and the flash memory 14 are interconnected by address buses, read data buses and control buses. Depending on the bus configuration, write data may be carried on a separate bus (not shown). Microcontroller 10 supplies a Next Access signal to bus interface unit 12. As indicated above, the Next Access signal is asserted when the next memory address equals the current memory address +1. The Next Access signal is a function of program flow and remains asserted when consecutive memory addresses are being accessed. The Next Access signal is deasserted when memory accesses are to non-consecutive addresses and when the memory is not being accessed. When the Next Access signal is asserted, the bus interface unit 12 enables the continued burst mode of flash memory 14. When the continued burst mode is enabled, flash memory 14 supplies data words from consecutive memory addresses beginning at the address supplied on the address bus. When the continued burst mode is deasserted, the current burst is discontinued and memory access begins at a new address. The subsequent access may be a single word access or another continued burst mode access.

An example comparing an embodiment of the invention with prior art techniques is shown in FIG. 2. The size of an instruction buffer in microcontroller 10 is set to 4 words, and 6 or 12 consecutive instructions are executed. In both cases, the instructions are spread across 3 blocks which fit in the instruction buffer. Columns 20 and 22 illustrate the case of a normal flash memory without burst mode having a 70 nS access time. Column 20 illustrates the example of a 12 instruction sequence which results in a total access time of 840 nS, and column 22 illustrates the example of a 6 instruction sequence which results in a total access time of 420 nS. Column 24 represents the case of a 12 instruction sequence using a burst buffer with 4 words in the buffer. In this case, the interface unit always reads a full block, which in this case is 4 words. In this case, there is no difference between the worst case and the best case, as the interface always reads a full block. Columns 26 and 28 illustrate a continued burst with variable length. Column 26 represents an instruction sequence of 12 instructions in consecutive addresses, and column 28 represents an instruction sequence of 6 instructions in consecutive addresses. The 12 instruction sequence results in a total access time of 290 nS, and the 6 instruction sequence results in a total access time of 170 nS using the continued burst mode. As can be seen from FIG. 2, significant improvements can be obtained using the continued burst mode of variable length.

The above description is intended to be illustrative and not exhaustive. The description will suggest many variations and alternatives to one of ordinary skill in this art. All these alternatives and variations are intended to be included within the scope of the attached claims. Those familiar with the art may recognize other equivalents to the specific embodiments described herein which equivalents are also intended to be encompassed by the claims attached hereto. Further, the particular features presented in the dependent claims below can be combined with each other in other manners within the scope of the invention such that the invention should be recognized as also specifically directed to other embodiments having any other possible combination of the features of the dependent claims.

What is claimed:

1. Digital processing apparatus comprising:
    a processor including a microcontroller for executing microcontroller instructions, the instructions including memory access instructions, said processor generating a next access signal that indicates if a next memory access by said processor is in sequence with a current memory access, wherein the next access signal is asserted when memory accesses are sequential and is deasserted when memory accesses are non-sequential;
    a flash memory having a continued burst mode of operation, said memory having a memory bus for communication with said processor; and
    a bus interface unit for controlling access to said memory in response to the memory access instructions, said bus interface unit enabling the continued burst mode of the memory while the next access signal is asserted and inhibiting the continued burst mode of the memory when the next access signal is deasserted to provide a continued burst mode of variable length in response to the next access signal and to avoid reading of unused words, wherein the variable length of the continued burst mode is dynamically controlled in response to the next access signal.

2. Digital processing apparatus as defined in claim 1, wherein said processor, said memory and said bus interface unit constitute a baseband processor for use in a wireless terminal.

3. Digital processing apparatus as defined in claim 1, wherein said processor, said memory and said bus interface unit are fabricated on a single substrate.

4. A method for accessing memory in a digital processing system, comprising:
    providing a processor including a microcontroller which executes microcontroller instructions including memory access instructions, said processor generating a next access signal that indicates if a next memory access by said processor is in sequence with a current memory access, wherein the next access signal is asserted when memory accesses are sequential and is deasserted when memory accesses are non-sequential;
    providing a flash memory having a continued burst mode of operation; and
    enabling the continued burst mode of the memory while the next access signal is asserted and inhibiting the continued burst mode of the memory when the next access signal is deasserted to provide a continued burst mode of variable length in response to the next access signal and to avoid reading of unused words, wherein the variable length of the continued burst mode is dynamically controlled in response to the next access signal.

5. A baseband processor for wireless applications comprising:
    a microcontroller for executing microcontroller instructions including memory access instructions, said microcontroller generating a next access signal that indicates if a next memory access by said microcontroller is in sequence with a current memory access, wherein the next access signal is asserted when memory accesses are sequential and is deasserted when memory accesses are non-sequential;

a flash memory having a continued burst mode of operation, said flash memory having a memory bus for communication with said microcontroller; and a bus interface unit for controlling access to said flash memory in response to the memory access instructions, said bus interface unit enabling the continued burst mode of the flash memory while the next access signal is asserted and inhibiting the continued burst mode of the memory when the next access signal is deasserted to provide a continued burst mode of variable length in response to the next access signal and to avoid reading of unused words, wherein the variable length of the continued burst mode is dynamically controlled in response to the next access signal, wherein said microcontroller, said flash memory and said bus interface unit constitute a baseband processor of a wireless terminal.

* * * * *

UNITED STATES PATENT AND TRADEMARK OFFICE
CERTIFICATE OF CORRECTION

| | | |
|---|---|---|
| PATENT NO. | : 7,007,132 B2 | Page 1 of 1 |
| APPLICATION NO. | : 10/230668 | |
| DATED | : February 28, 2006 | |
| INVENTOR(S) | : Joern Soerensen et al. | |

It is certified that error appears in the above-identified patent and that said Letters Patent is hereby corrected as shown below:

On The Title Page, Item (75), the second Inventor, Paul D. Krivacek's, city of residence should be changed from "Cambridge, MA" to --Winchester, MA--.

Signed and Sealed this

Fourth Day of September, 2007

JON W. DUDAS
*Director of the United States Patent and Trademark Office*